United States Patent
Marbell et al.

(10) Patent No.: US 9,337,183 B2
(45) Date of Patent: May 10, 2016

(54) TRANSFORMER INPUT MATCHED TRANSISTOR

(71) Applicant: Infineon Technologies North America Corp., Milpitas, CA (US)

(72) Inventors: Marvin Marbell, Morgan Hill, CA (US); EJ Hashimoto, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 176 days.

(21) Appl. No.: 14/069,867

(22) Filed: Nov. 1, 2013

(65) Prior Publication Data
US 2015/0123208 A1    May 7, 2015

(51) Int. Cl.
*H01L 29/76*    (2006.01)
*H01L 27/06*    (2006.01)
*H01L 23/00*    (2006.01)

(52) U.S. Cl.
CPC ............ *H01L 27/0629* (2013.01); *H01L 24/49* (2013.01); *H01L 2224/48091* (2013.01); *H01L 2224/48137* (2013.01); *H01L 2224/4903* (2013.01); *H01L 2224/49111* (2013.01); *H01L 2224/49175* (2013.01); *H01L 2924/00014* (2013.01); *H01L 2924/12042* (2013.01); *H01L 2924/181* (2013.01); *H01L 2924/3011* (2013.01); *H01L 2924/30111* (2013.01)

(58) Field of Classification Search
CPC ..... H01L 51/0036; H01L 51/44; H01L 51/52; H01L 51/56; H05K 1/095
USPC .......................................... 257/379, 529, 536
See application file for complete search history.

(56) References Cited

U.S. PATENT DOCUMENTS

| 2002/0105383 A1* | 8/2002 | Cheo ....................... H03F 3/602 330/295 |
| 2005/0231278 A1* | 10/2005 | Blednov .................. H01L 24/49 330/124 R |
| 2008/0246547 A1* | 10/2008 | Blednov .................. H01L 23/66 331/109 |

FOREIGN PATENT DOCUMENTS

| JP | 62256526 A | 11/1987 |
| JP | 08124685 A | 5/1996 |
| KR | 1020120125811 A | 11/2012 |

* cited by examiner

*Primary Examiner* — Andy Huynh
(74) *Attorney, Agent, or Firm* — Murphy, Bilak & Homiller, PLLC (57) ABSTRACT

An RF power transistor package includes an input lead, an output lead, and an RF power transistor having a gate, a drain and a defined gain over an RF frequency range for which the RF power transistor is configured to operate. The RF power transistor package further includes a transformer electrically isolating and inductively coupling the gate of the RF power transistor to the input lead. The transformer is configured to block signals below the RF frequency range of the RF power transistor and pass signals within the RF frequency range of the RF power transistor. The RF power transistor package also includes a DC feed terminal for providing DC bias to the gate of the RF power transistor.

22 Claims, 12 Drawing Sheets

TRANSFORMER INPUT MATCHED TRANSISTOR

TECHNICAL FIELD

The instant application relates to RF power transistors, and more particularly to input matching for RF power transistors.

BACKGROUND

High power RF transistors such as LDMOS (laterally diffused metal oxide semiconductor) transistors have input and output impedances significantly lower than 50 ohms (high Q impedance), yet the functioning RF circuit has to be matched to 50 ohms. To facilitate the impedance match to 50 ohms, the RF transistor is typically designed with a match circuit on the input and output of the transistor that is integrated into the packaged transistor. The match network helps reduce the Q of the packaged transistor, making it easier to match to 50 ohms. Typically the improvement in impedance can only be achieved in a narrow frequency range. In addition, the match network helps to shape the frequency response of the transistor and amplifier such that there is high gain at the desired operating frequency, and the gain is suppressed outside that frequency range. Typically the gain at low frequencies is not adequately suppressed, and there can be a high forward voltage gain bump at low frequencies that leads to instability, ruggedness and linearity correction problems for the amplifier. Apart from the gain response of the transistor, the maximum available gain (Gmax) of the amplifier at low frequencies can also lead to stability, ruggedness and correction problems when not properly suppressed. This is particularly problematic for RF transistor applications where the signal input to the transistor is a complex modulation of several high frequency tones (e.g. 2.0 GHz and 2.1 GHz tones), the mixing of which results in signals at low frequencies (e.g. 100 MHz in this example) which are amplified by the low frequency forward voltage gain bump.

In one conventional implementation, the RF transistor is matched on the input with a low-pass L-C-L network. This network matches the input impedance of the transistor to a lower Q over a specific frequency range. However, the low-pass network does not suppress the low frequency response of the transistor and hence the maximum available gain remains high at low frequencies leading to stability, ruggedness and linearity correction problems. The gain response of the transistor also shows a high forward voltage gain bump at low frequency.

In another conventional implementation, the transistor input is matched with a low-pass L-C-L network and the output is matched with a high-pass shunt L network terminating on a blocking capacitor which has a low-frequency bypass capacitor connected in parallel through an L-R network. The low-frequency bypass capacitor reduces the forward voltage gain bump at low frequencies for the case where the source and load are matched to 50 ohms. However, this implementation does not suppress the maximum available gain at low frequencies, hence when the source and/or load is mismatched from 50 ohms high gain at low frequencies results which leads to stability, ruggedness and linearity correction problems.

SUMMARY

According to an embodiment of an RF power transistor package, the RF power transistor package comprises an input lead, an output lead, and an RF power transistor having a gate, a drain and a defined gain over an RF frequency range for which the RF power transistor is configured to operate. The RF power transistor package further comprises a transformer electrically isolating and inductively coupling the gate of the RF power transistor to the input lead. The transformer is configured to block signals below the RF frequency range of the RF power transistor and pass signals within the RF frequency range of the RF power transistor. The RF power transistor package also comprises a DC feed terminal for providing DC bias to the gate of the RF power transistor.

According to another embodiment of an RF power transistor package, the RF power transistor package comprises an input lead, an output lead, and an RF power transistor having an input, an output, an input impedance, an output impedance, and a defined gain over an RF frequency range for which the RF power transistor is configured to operate. The RF power transistor package further comprises an output match circuit, a transformer and a DC feed terminal. The output match circuit electrically couples the output of the RF power transistor to the output lead, and is configured to match the output impedance of the RF power transistor to an impedance seen at the output lead over the RF frequency range of the RF power transistor. The output match circuit causes a low frequency forward voltage gain bump in the gain response of the RF power transistor at frequencies below the RF frequency range of the RF power transistor. The transformer electrically isolates and inductively couples the input of the RF power transistor to the input lead, and is configured to block signals having a frequency below the RF frequency range of the RF power transistor so that low frequency signals are not amplified by the low frequency forward voltage gain bump. The DC feed terminal provides DC bias to the input of the RF power transistor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4, which includes

FIG. 7, which includes

FIG. 8, which includes

FIG. 9, which includes

DETAILED DESCRIPTION

According to embodiments described herein, a transformer principle is used at the input of an RF power transistor to match the input impedance and create a high-pass frequency response that suppresses low frequency gain. In a transformer, varying ac current in the primary (P) winding creates a varying magnetic flux which induces a varying voltage in the secondary (S) winding. At low frequencies and DC, the input lead of the package is isolated from the input (gate) of the RF power transistor by the transformer which only works effectively at high frequency, thus the transformer forms a high-pass network. This configuration effectively reduces and suppresses both the maximum available gain and the forward voltage (S21) gain bump at low frequencies. The impedance at the input lead of the package is no longer dependent on the input impedance of the RF power transistor, but instead is dependent on the electrical characteristics of the primary winding.

By effectively suppressing the maximum available gain at low frequencies, the packaged RF power transistor shows low gain at low frequencies even when the source or load impedance is randomly mismatched away from 50 Ohms. This improves the ruggedness of the transistor in high mismatch (high VSWR–Voltage Standing Wave Ratio) ruggedness testing. Typically ruggedness testing is done at a high VSWR (e.g. 10:1 VSR). Also in some amplifier architectures such as Doherty amplifiers, the load impedance seen by the amplifier may vary significantly from 50 ohms. The transformer embodiments described herein can improve the ruggedness, stability and linearization ability of an amplifier even when the source and load impedances are highly mismatched e.g. in the case of a Doherty application.

Figure 1:
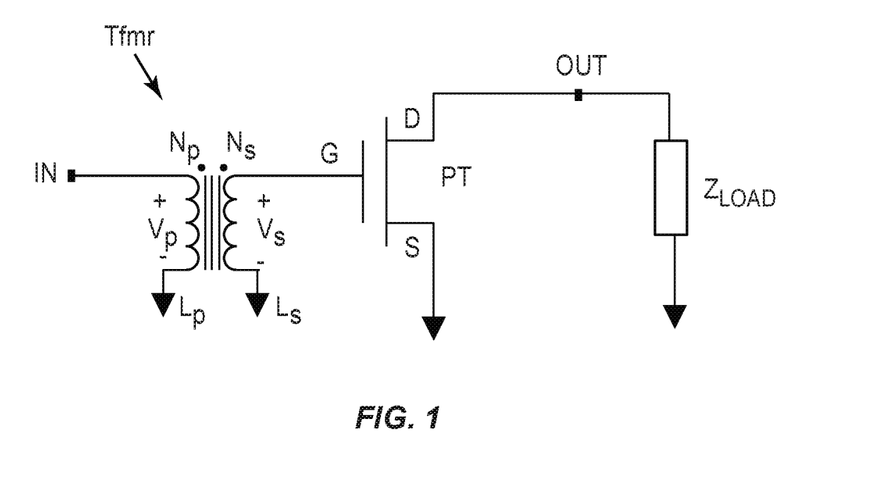
FIG. 1 illustrates a schematic diagram of an embodiment of a packaged RF power transistor with a transformer at the input of the transistor.

FIG. 1 illustrates a circuit schematic of a packaged RF power transistor (PT) such as an LDMOS transistor having a gate (G), source (S) and drain (D). The gate is the input of the RF power transistor and the drain is the output of the transistor. The RF power transistor has a defined gain response such as maximum available gain or S21 gain over an RF frequency range for which the RF power transistor is configured to operate. 'S21 gain' is a scattering or S-parameter corresponding to the forward voltage gain of the RF power transistor in response to steady state stimuli by electrical signals. Other typical scattering or S-parameters for a two-port device include S11 (input port voltage reflection coefficient), S12 (reverse voltage gain), and S22 (output port voltage reflection coefficient).

The low frequency cutoff of the RF power transistor defines the low corner of the RF frequency range for which the RF power transistor is configured to operate. For example, the RF power transistor can have a low frequency cutoff at 1.5 GHz, 1.6 GHz, 2.0 GHz, 2.6 GHz, 3.5 GHz, etc. depending on the type of application for which the transistor is designed. The low frequency cutoff of the RF power transistor can extend down to 1.0 GHz or even down to 700 MHz, depending on the application.

In each case, a transformer (Tfmr) electrically isolates and inductively couples the gate of the RF power transistor to an input lead (IN) of the package. The transformer blocks signals below the RF frequency range of the RF power transistor and passes signals within the RF frequency range of the RF power transistor. As such, the transformer forms a high-pass network at the input of the RF power transistor. This high-pass network formed by the transformer can be used to match the input impedance and create a high-pass frequency response that suppresses low frequency gain. The input match is provided over a wideband range since the transformer acts like a high-pass filter. This inductive coupling configuration is particularly useful for applications where the signal input to the RF power transistor is like a complex modulation of several high frequency tones (e.g. 2.0 GHz and 2.1 GHz tones), the mixing of which results in signals at low frequencies (e.g. 100 MHz in this example). The transformer blocks these low frequency signals from being input to the RF power transistor, preventing amplification of undesired low frequency signals by the low frequency forward voltage gain bump which may be present in the gain response of the transistor. Operation of the transformer is explained in more detail next.

Figure 2:
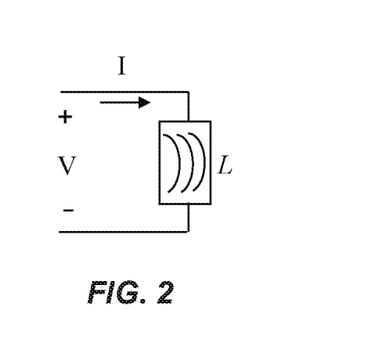
FIGS. 2 and 3 illustrate the inductive coupling behavior of wires.

A single wire, or group of wires act as an electrical inductor with inductance L, so that when driven from a single port, as shown in FIG. 2, the voltage (V) and current (I) through L are related by the equation:

$$V = L\frac{dI}{dt} \qquad (1)$$

This behavior is based on two principles of physics: a steady current creates a steady magnetic field (Oerstead's law) and a time-varying magnetic field induces a voltage in a nearby conductor (Faraday's law of induction).

Figure 3:
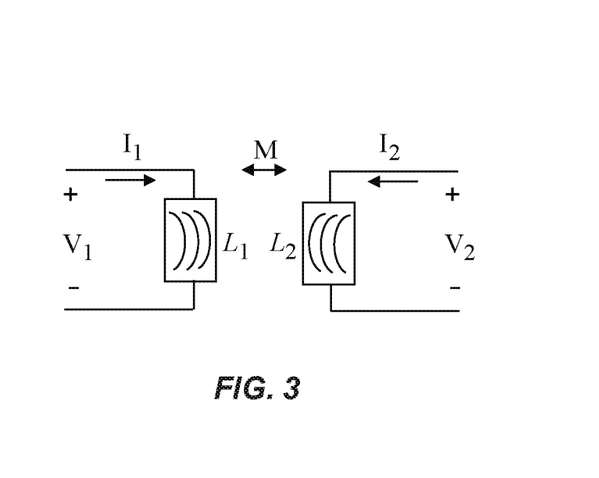

The time-varying magnetic field in one set of wires can also induce a time-varying voltage across a separate set of wires when in close enough proximity. This is described by FIG. 3 and the following equation:

$$V_1 = L_1 \frac{dI_1}{dt} + M\frac{dI_2}{dt} \qquad (2)$$
$$V_2 = L_2 \frac{dI_2}{dt} + M\frac{dI_1}{dt}$$

where M is the mutual inductance between $L_1$ and $L_2$. The mutual inductance is also related to the coupling coefficient k as follows:

$$M = k\sqrt{L_1 L_2} \qquad (3)$$

The coupling coefficient K is 0<K<1, with K=1 representing perfect coupling between L1 and L2 and K=0 representing zero coupling. The sign of K can also change depending on the direction of current flow in the wires.

The mutual inductance can be calculated using Neumann's inductance equation in which the mutual inductance $L_{ij}$ between a closed loop Ci and a closed loop Cj is defined as:

$$L_{ij} = \frac{\text{flux linking } C_j \text{ due to a current in } C_i}{\text{current in } C_i} \quad (4)$$
$$= \frac{\mu_0}{4\pi} \oint_{C_i} \oint_{C_j} \frac{dl_i \cdot dl_j}{r}$$

where r is the distance between the points on the contours Ci and Cj. The parameter r can also be interpreted as the separation between two parallel wires, and can be deduced from equation (4) in that the mutual inductance between two parallel wires is reduced as the separation distance r increases. The parameter $\mu_0$ is the permeability of free space (also referred to as the magnetic constant), and is given by $\mu_0 = 4\pi \times 10^{-7}$ H/m. For wires enclosed in a material with a higher permeability $\mu$, the mutual inductance is higher.

The mutual inductance given by equation (4) can be analytically evaluated and in a simplified case of two parallel wires with a length l and separation d, where l>>d, the mutual inductance can be expressed as given by:

$$M = \frac{\mu_0 l}{2\pi}\left[\ln\left(\frac{2l}{d}\right) - 1 + \frac{d}{l}\right] \quad (5)$$

In some embodiments, the primary (P) and secondary (S) wires of the transformer at the input of the RF power transistor are realized by bond wires.

Figure 4A:
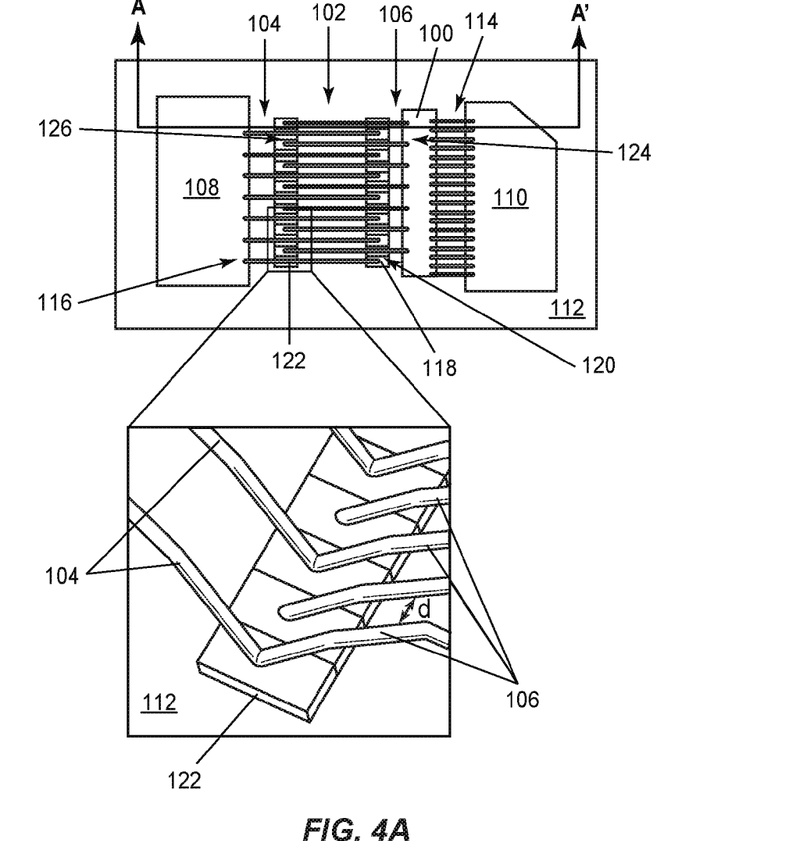
FIGS. 4A and 4B, illustrates different views of an embodiment of an RF power transistor package with a transformer formed from bond wires at the input of the transistor.
Figure 4B:
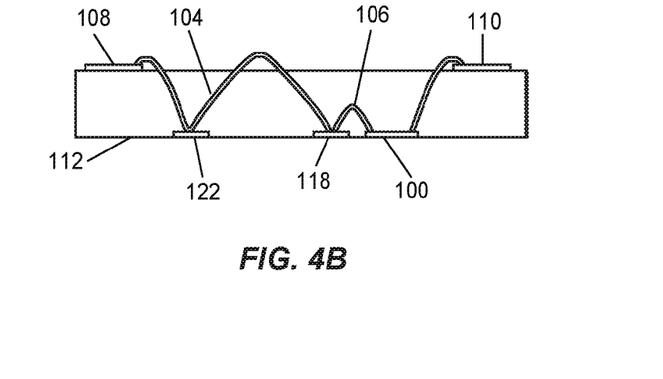

FIG. 4, which includes FIGS. 4A and 4B, illustrates one embodiment of an RF transistor package including an RF power transistor die 100 and a transformer 102 at the input (gate) of the transistor die 100 which is formed from bond wires 104, 106. FIG. 4A shows a top-down plan view of the package, including an exploded view of part of the transformer bond wire arrangement. FIG. 4B shows a cross-sectional view of the package along the line labeled A-A' in FIG. 4A.

The package has an input lead 108 and an output lead 110 attached to a support member 112 such as a ceramic material. The output (e.g. drain) of the RF power transistor die 100 is electrically connected to the output lead 110 of the package by a plurality of bond wires 114. The transformer 102 electrically isolates and inductively couples the input (gate) of the RF power transistor die 100 to the input lead 108 of the package, and is configured to block signals having a frequency below the RF frequency range of the RF power transistor included in the die 100 so that low frequency signals are not amplified by a low frequency forward voltage gain bump which may be present in the gain response of the transistor.

According to the embodiment shown in FIG. 4, the transformer 102 comprise a set of primary bond wires 104 connected to the input lead 108 of the package and a set of secondary bond wires 106 connected to the gate of the RF power transistor die 100. The set of primary bond wires 104 is electrically disconnected from the set of secondary bond wires 106, but inductively coupled to the set of secondary bond wires 106 over at least part of the length of the bond wires 104, 106. The mutual coupling coefficient k between the primary and secondary sets of bond wires 104, 106 forming the transformer 102 is a function of the separation distance d between adjacent ones of the primary and secondary bond wires 104, 106.

Figure 5:
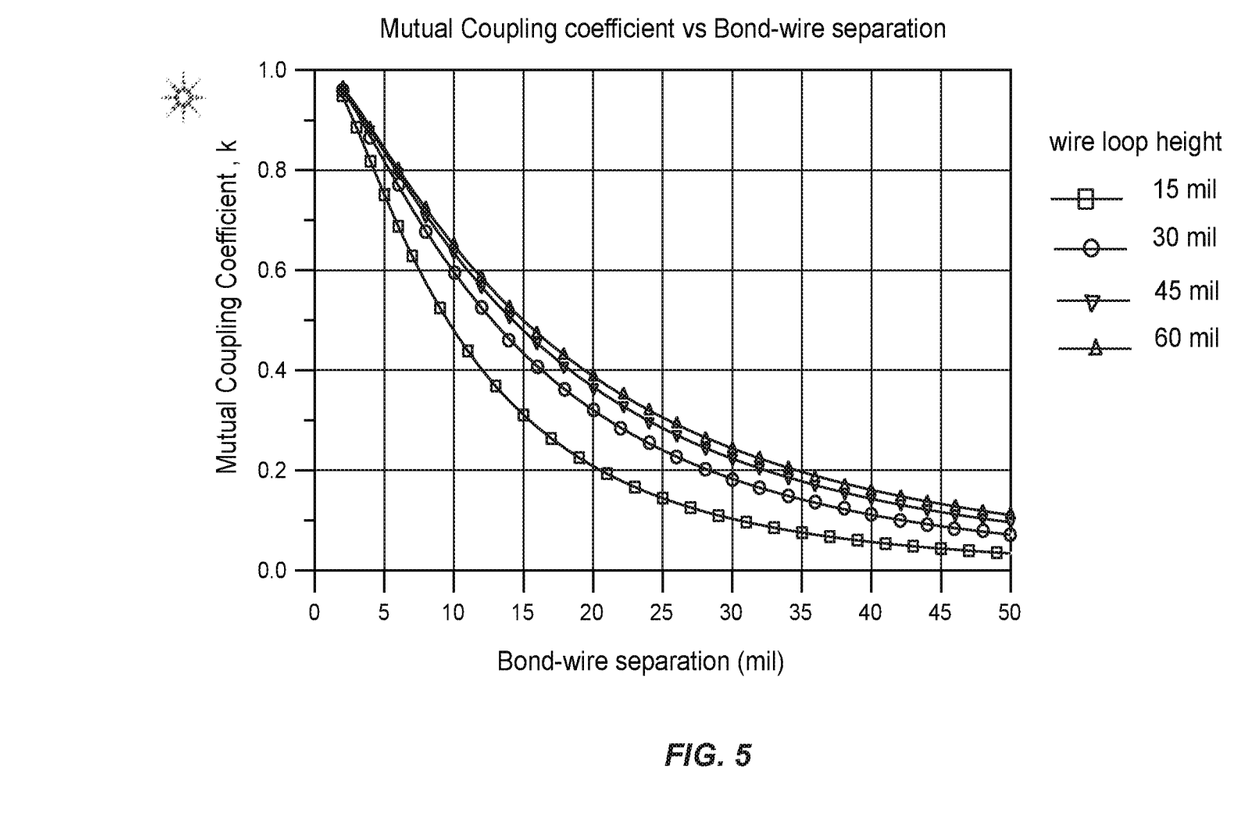
FIG. 5 is a graph illustrating the mutual coupling coefficient of the transformer in FIG. 4 as a function of bond wire separation.

FIG. 5 shows the mutual coupling coefficient k as a function of the separation distance d for different bond wire loop heights. In one embodiment, the height of the primary bond wires 104 ranges between 10 mils and 60 mils, the height of the secondary bond wires 106 also ranges between 10 mils and 60 mils, and adjacent ones of the primary and secondary bond wires 104, 106 are spaced apart by a distance d which is varied from 2 to 50 mils. Other heights and spacing ranges are contemplated, and therefore within the scope of the embodiments described herein. By selecting the bond wire height and spacing dimensions appropriately, a mutual coupling coefficient k of at least 0.25, at least 0.5 or even higher can be achieved, as given by equation (3).

Figure 6:
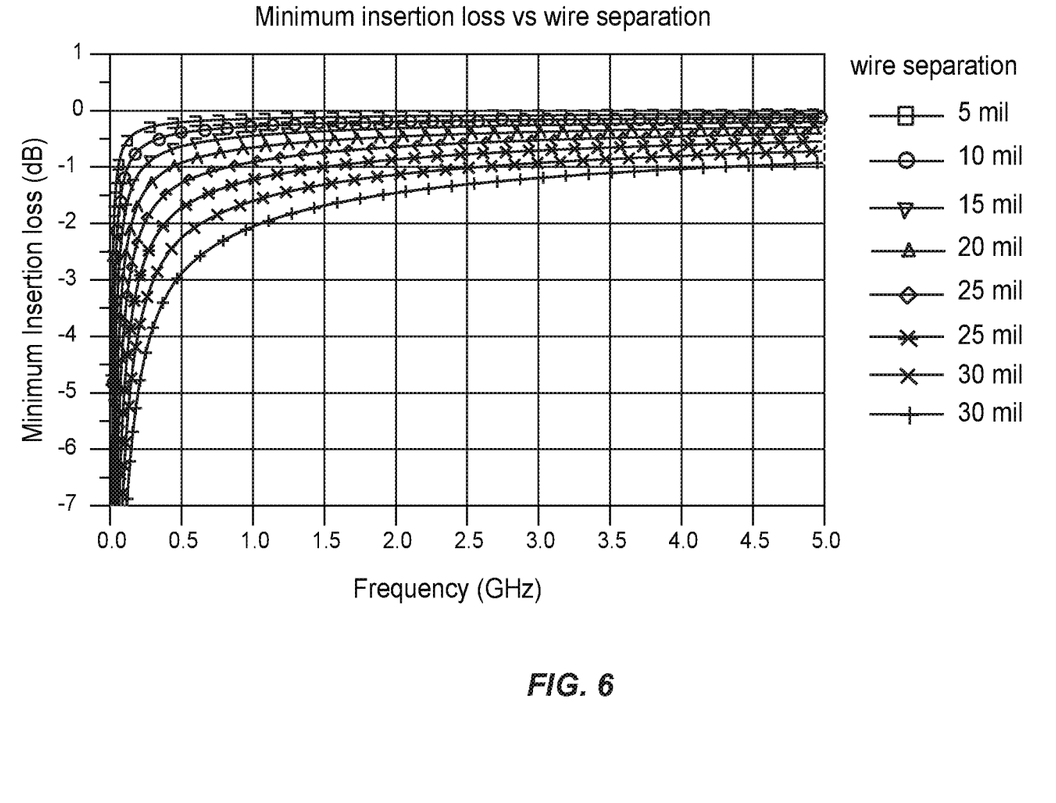
FIG. 6 is a graph illustrating the minimum insertion loss of the transformer in FIG. 4 as a function of bond wire separation.

FIG. 6 shows the minimum insertion loss (in dB) of the transformer network as a function of frequency and bond wire separation. The insertion loss is reduced for smaller bond wire separation, and the low frequency cutoff is moved to lower frequencies with a sharper roll-off. Preferably the primary and secondary bond wires 104, 106 have the same shape and spacing, but such a configuration of the transformer wires 104, 106 is not required.

Further according to the package embodiment shown in FIG. 4, the primary bond wires 104 are connected to the input lead 108 of the package at a first end 116, to a first capacitor 118 at a second end 120 and to a second capacitor 122 between the first and second ends 116, 120. Also according to the embodiment of FIG. 4, the secondary bond wires 106 are connected to the gate of the RF power transistor die 100 at a first end 124, to the second capacitor 122 at a second end 126 and to the first capacitor 118 between the first and second ends 124, 126. Any standard wire bonding technique can be used to form these connections.

To ensure that the primary bond wires 104 of the transformer 102 remain electrically disconnected from the secondary bond wires 106, the first capacitor 118 is segmented between adjacent ones of the primary and secondary bond wires 104, 106. The second capacitor 122 is likewise segmented between adjacent ones of the primary and secondary bond wires 104, 106, to electrically isolate the set of primary bond wires 104 from the set of secondary bond wires 106 at the second capacitor 122. In one embodiment, the capacitors 118, 122 can be segmented by physical separation as shown in FIG. 4A such as by being sawed, laser cut, etc. in order to ensure proper electrical isolation. Adjacent primary and secondary bond wires 104, 106 are spaced (d) close enough to one another to ensure a sufficiently high mutual coupling coefficient as previously described herein. Also according to the embodiment of FIG. 4, the transformer 102 comprises the same number of primary (P) bond wires 104 as secondary (S) bond wires 106, yielding a transformer turn ratio ($N_P/N_S$) of 1:1. Other turn ratios can be realized by having unequal numbers of primary and secondary bond wires 104, 106.

Figure 7A:
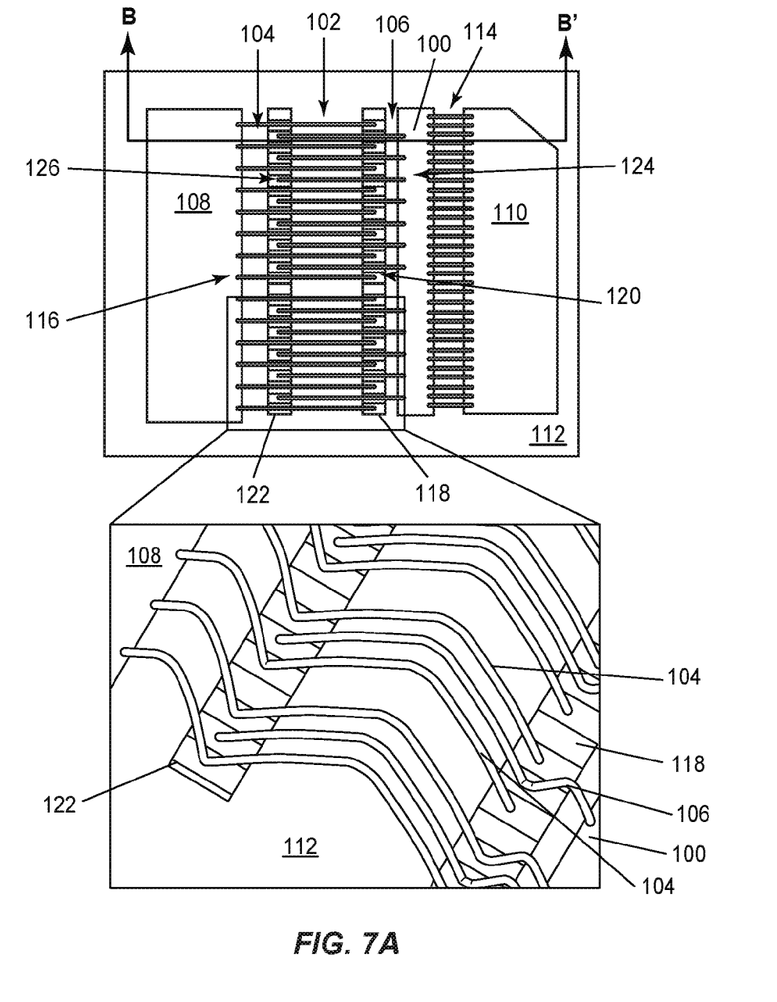
FIGS. 7A and 7B, illustrates different views of another embodiment of an RF power transistor package with a transformer formed from bond wires at the input of the transistor.
Figure 7B:
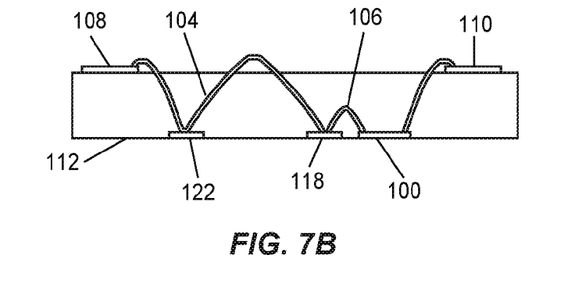

FIG. 7, which includes FIGS. 7A and 7B, illustrates another embodiment of an RF transistor package including an RF power transistor die 100 and a transformer 102 at the input of the die 100 which is formed from bond wires 104, 106. FIG. 7A shows a top-down plan view of the package, including an exploded view of part of the transformer bond wire arrangement. FIG. 7B shows a cross-sectional view of the package along the line labeled B-B' in FIG. 7A. The embodiment shown in FIG. 7 is similar to the embodiment shown in FIG. 4, however, the transformer 102 includes twice as many primary bond wires 104 as secondary bond wires 106, yielding a turn ratio ($N_P/N_S$) of 2:1. Conversely the transformer 102 can include twice as many secondary bond wires 106 as primary bond wires 104, yielding a turn ratio ($N_P/N_S$) of 1:2. In general the transformer 102 can have any desired turn ratio (e.g. 1:1, 2:1, 4:1, 1:2, 1:4, etc.) by appropriate selection of the number of primary and secondary bond wires 104, 106, to match the input impedance of the RF power transistor to the impedance seen at the input lead 108 of the package over the RF frequency range of the RF power transistor.

Figure 8A:
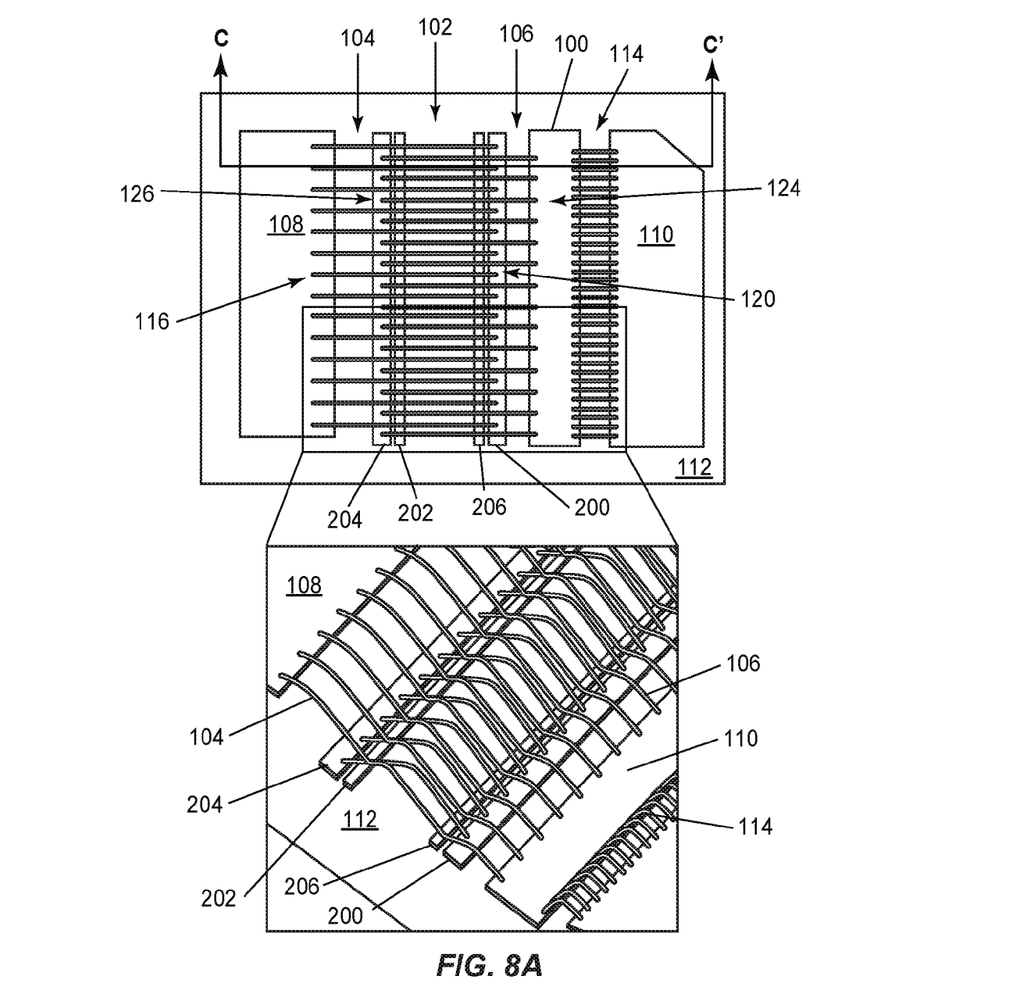
FIGS. 8A and 8B, illustrates different views of yet another embodiment of an RF power transistor package with a transformer formed from bond wires at the input of the transistor.
Figure 8B:
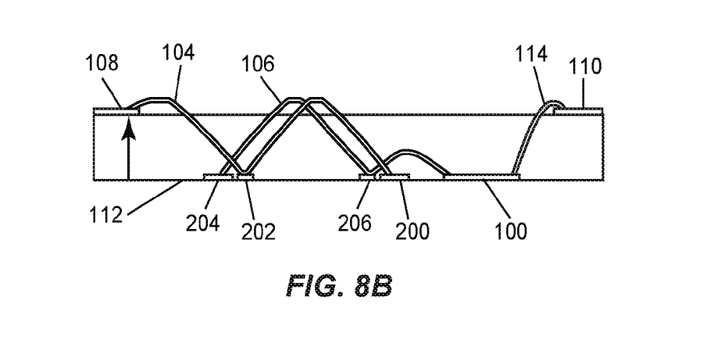

FIG. 8, which includes FIGS. 8A and 8B, illustrates yet another embodiment of an RF transistor package including an RF power transistor die 100 and a transformer 102 at the input of the die 100 which is formed from bond wires 104, 106. FIG. 8A shows a top-down plan view of the package, including an exploded view of part of the transformer bond wire arrangement. FIG. 8B shows a cross-sectional view of the package along the line labeled C-C' in FIG. 8A. The embodiment shown in FIG. 8 is similar to the embodiment shown in FIG. 4, however, the set of primary bond wires 104 is connected to the input lead 108 of the package at a first end 116, to a first capacitor 200 at a second end 120 and to a second capacitor 202 between the first and second ends 116, 120. Also, the set of secondary bond wires 106 is connected to the gate of the RF power transistor at a first end 124, to a third capacitor 204 at a second end 126 and to a fourth capacitor 206 between the first and second ends 124, 126. As such, both of the two input capacitors 118, 122 shown in FIG. 4 are each divided into two physically separate capacitors 200, 202, 204, 206 in FIG. 8. As such, the primary and secondary bond wires 104 106 do not contact the same capacitor and thus the individual capacitors 200, 202, 204, 206 do not need to be segmented between adjacent primary/secondary bond wire connections as shown in FIG. 4. Instead each of the input capacitors 200, 202, 204, 206 can be a single, continuous capacitor.

Figure 9A:
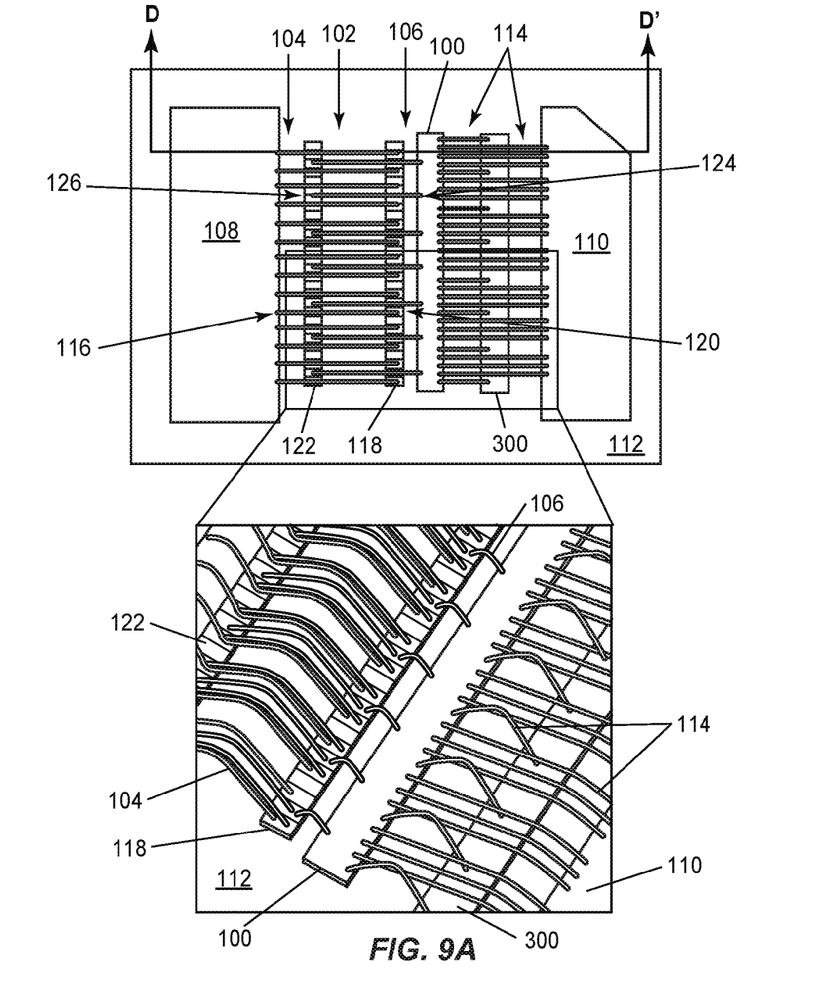
FIGS. 9A and 9B, illustrates different views of still another embodiment of an RF power transistor package with a transformer formed from bond wires at the input of the transistor.
Figure 9B:
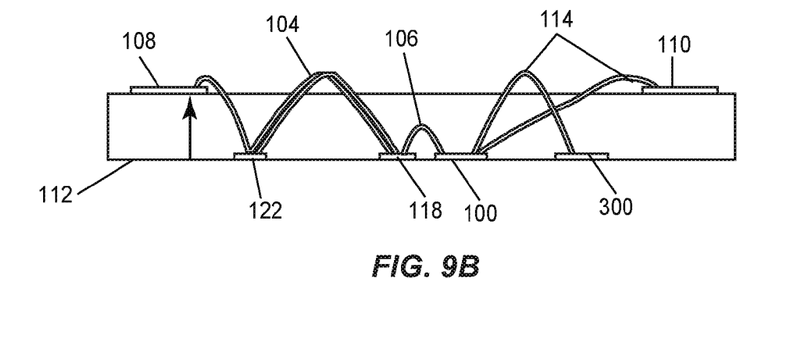

FIG. 9, which includes FIGS. 9A and 9B, illustrates still another embodiment of an RF transistor package including an RF power transistor die 100 and a transformer 102 at the input of the die 100 which is formed from bond wires 104, 106. FIG. 9A shows a top-down plan view of the package, including an exploded view of part of the transformer bond wire arrangement. FIG. 9B shows a cross-sectional view of the package along the line labeled D-D' in FIG. 9A. The embodiment shown in FIG. 9 is similar to the embodiment shown in FIG. 4, however, the package also includes an output match circuit including the output bond wires 114 and an output capacitor 300 that electrically couples the drain of the RF power transistor to the output lead 110 of the package. Also, the primary bond wires 104 can be stacked one above the other as shown in FIG. 9 instead of being spaced apart laterally.

In either case, the output match circuit is configured to match the output impedance of the RF power transistor to the impedance seen at the output lead 110 of the package over the RF frequency range of the RF power transistor. The output match circuit can cause the low frequency forward voltage gain bump in the gain response of the RF power transistor at frequencies below the RF frequency range of the RF power transistor, as shown in FIG. 10.

Figure 10:
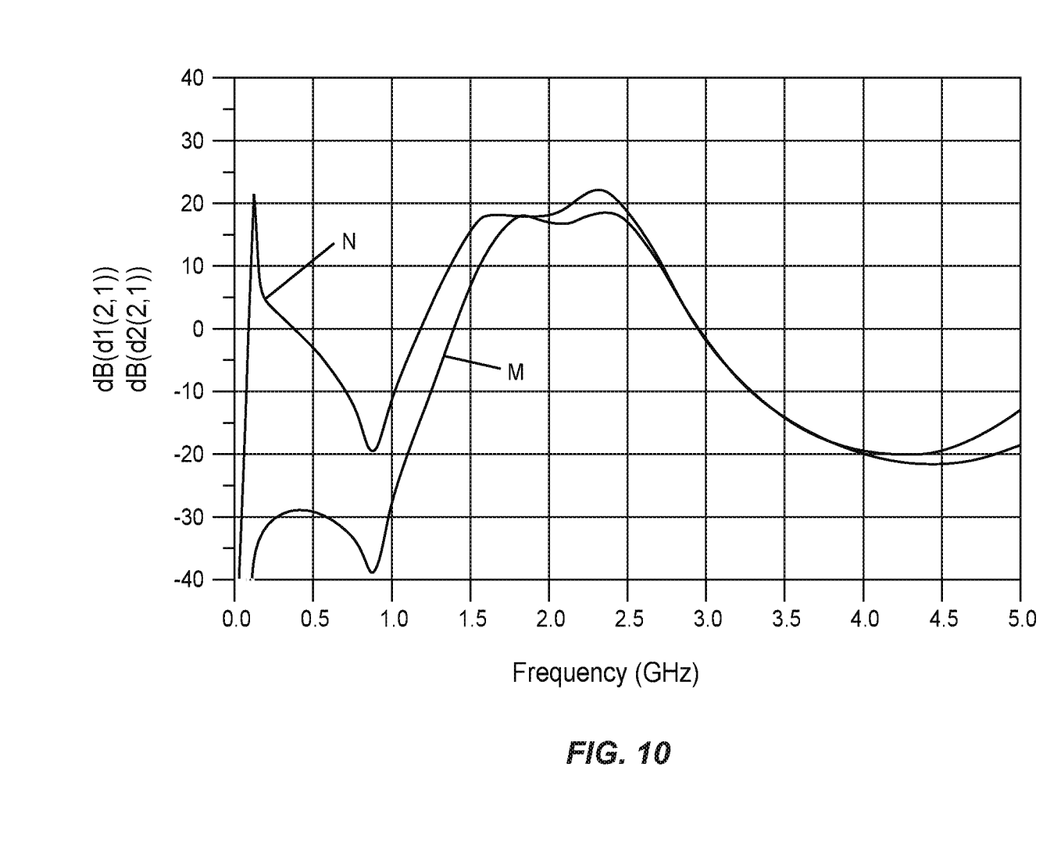
FIG. 10 is a graph illustrating the forward voltage gain of an RF power transistor having a transformer at the input of the transistor compared to no transformer at the input.

FIG. 10 plots S21 gain with (curve M) and without (curve N) the transformer 102 at the input of the RF power transistor, as a function of frequency. In both cases an output match circuit is present at the output of the RF power transistor, but without ideal 50 Ohm impedance matching at both the input and output of the RF power transistor. The S21 gain has a sizeable increase at low frequencies below 1 GHz without the input transformer 102, owing to the low frequency forward voltage gain bump in the gain response of the RF power transistor caused by the output match circuit. With the input transformer 102, which acts like a high pass filter, low frequency signals below 1 GHz are blocked and therefore not amplified by the low frequency forward voltage gain bump in the gain response of the RF power transistor. The S21 gain with the transformer 102 at the input of the RF power transistor is relatively unchanged at low frequencies regardless of whether 50 Ohm impedance matching is provided at the input and output of the RF power transistor.

Figure 11:
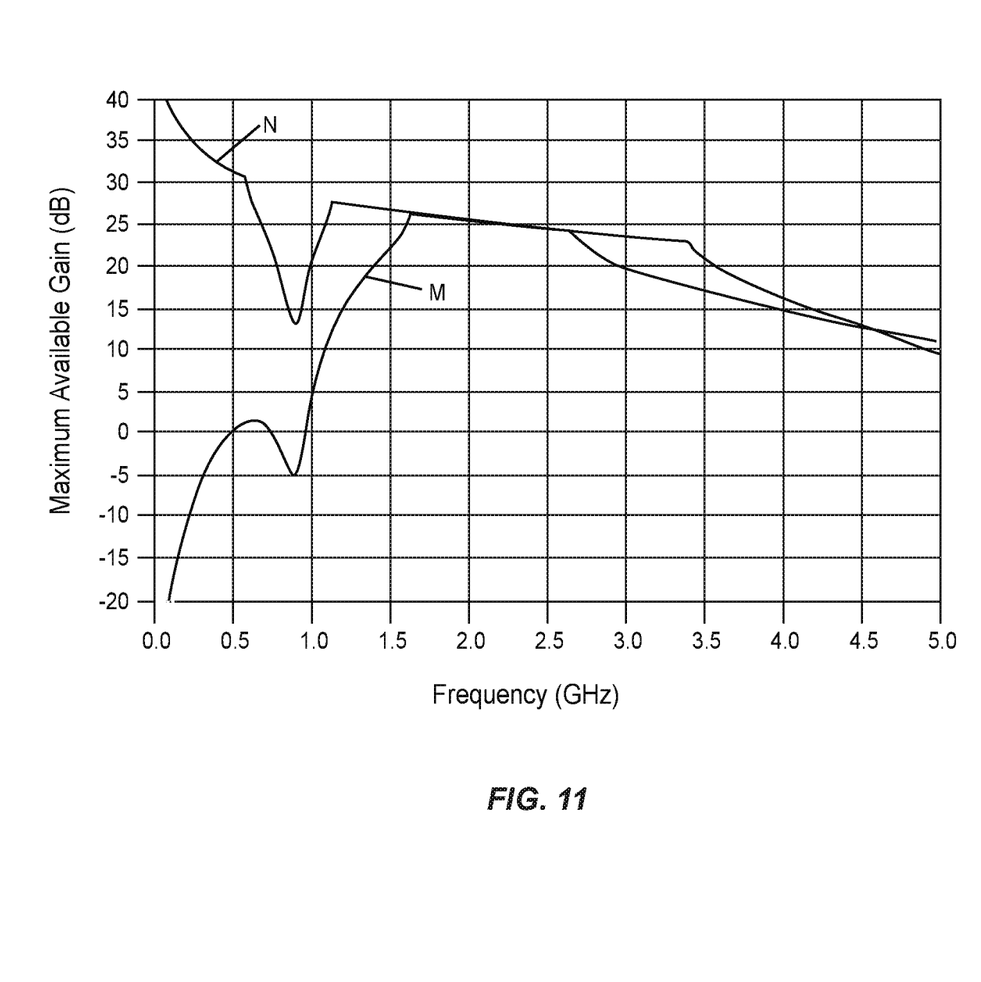
FIG. 11 is a graph illustrating the maximum available gain of an RF power transistor having a transformer at the input of the transistor compared to no transformer at the input.

FIG. 11 shows a similar plot for the maximum available gain of the RF power transistor with (curve M) and without (curve N) the transformer 102 at the input of the RF power transistor, as a function of frequency. As with the S21 gain, low frequency signals below 1 GHz have significantly attenuated maximum available gain when the input transformer 102 is included in the circuit. Also like the S21 gain, the maximum available gain is relatively unchanged at low frequencies regardless of whether 50 Ohm impedance matching is provided at the input and output of the RF power transistor. As such, the input transformer embodiments described herein improve the ruggedness, stability and linearization ability of the RF power transistor even when the source and load impedances are highly mismatched e.g. in the case of a Doherty application.

Figure 12:
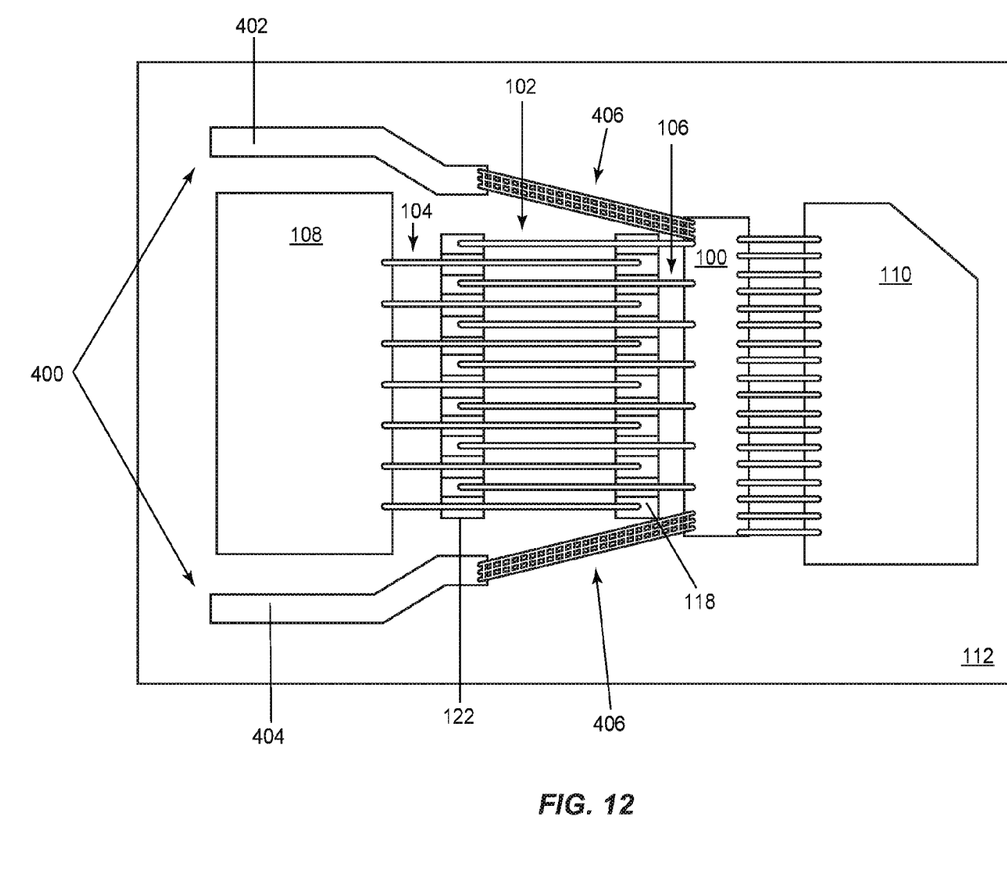
FIG. 12 illustrates a top down plan view of an embodiment of an RF power transistor package with a transformer formed from bond wires at the input of the transistor and a DC feed terminal for providing DC bias to the gate of the transistor.

FIG. 12 illustrates a top down plan view of another embodiment of an RF transistor package including an RF power transistor die 100 and a transformer 102 at the input of the die 100 which is formed from bond wires 104, 106. The embodiment shown in FIG. 12 is similar to the embodiment shown in FIG. 4, however, the package also includes a DC feed terminal 400 for providing DC bias to the gate of the RF power transistor. Since the transformer 102 does not allow DC to pass through it, DC bias can be applied to the gate of the RF power transistor through the DC feed terminal 400. DC bias can be provided to the drain (output) of the RF power transistor through the output lead 110 of the package or a similar DC feed terminal (not shown) at the output side of the package. According to the embodiment of FIG. 12, the DC feed terminal 400 includes lateral segments 402, 404 that extend along the sides of the input lead 108 of the package. Bond wires 406 connect each segment 402, 404 of the DC feed terminal 400 to the gate of the RF power transistor.

Figure 13:
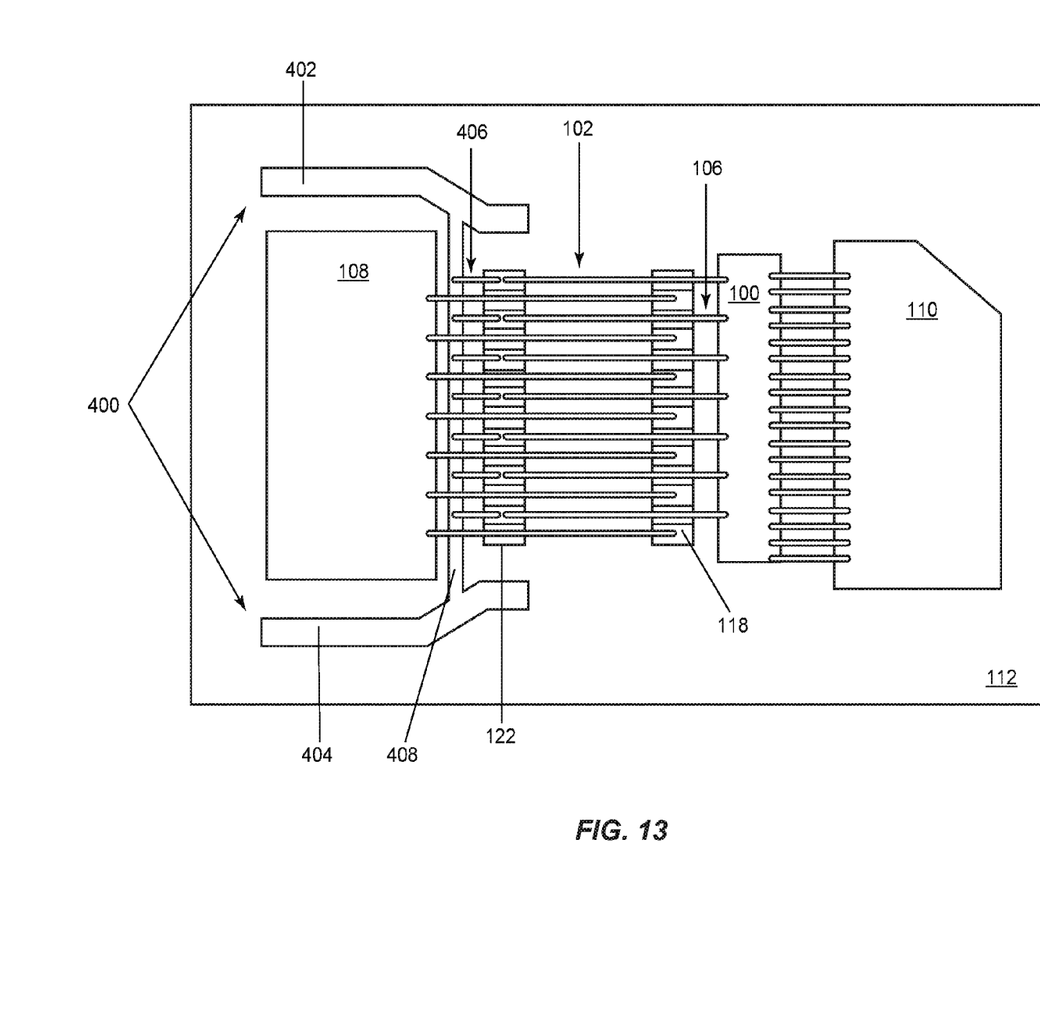
FIG. 13 illustrates a top down plan view of another embodiment of an RF power transistor package with a transformer formed from bond wires at the input of the transistor and a DC feed terminal for providing DC bias to the gate of the transistor.

FIG. 13 illustrates a top down plan view of another embodiment of an RF transistor package including an RF power transistor die 100 and a transformer 102 at the input of the die 100 which is formed from bond wires 104, 106. The embodiment shown in FIG. 13 is similar to the embodiment shown in FIG. 12, however, the DC feed terminal 400 further includes an additional segment 408 connecting the lateral segments 402, 404 between the input lead 108 of the package and one of the capacitors 122 to which the secondary bond wires 106 of the transformer 102 are connected. According to this embodiment, the secondary bond wires 106 of the transformer 102 provide the DC bias to the gate input of the RF power transistor.

According to the embodiments previously described herein, an input match is provided from two sets of gate wires (primary and secondary) running parallel to each other and electrically isolated from each other, forming an impedance matching transformer. Due to the close proximity of the two sets of wires to each other, there is effective inductive coupling through the surrounding material such as air or other dielectric (e.g. such as plastic molding compound). RF energy in the primary set of gate wires creates a varying magnetic flux in the surrounding material, which then induces RF energy in the secondary set of gate wires connected to the RF power transistor. This way, RF energy is transmitted through the transformer to the transistor, but at low frequencies (baseband and DC) the RF energy is suppressed and not transmitted. The primary and secondary gate wires may be terminated on RF capacitors also acting as DC blocking capacitors to prevent DC leakage to ground. The RF capacitors can be segmented into multiple pieces in some cases depending on the package configuration, such that the primary and secondary gate wires are isolated from each other. DC voltage to the input (gate) of the RF power transistor can be feed directly on the secondary gate wires or the transistor gate pad by a DC feed terminal.

Figure 14:
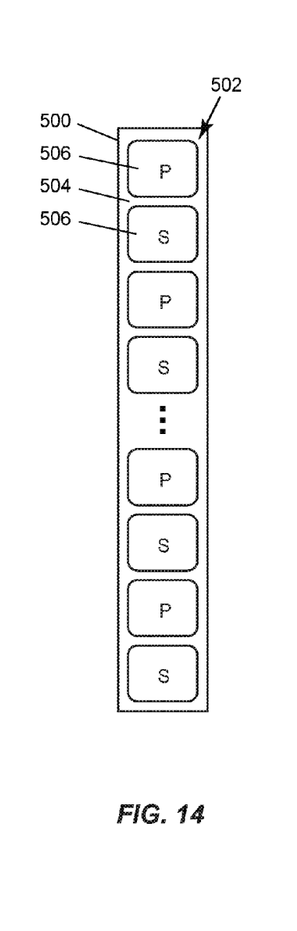
FIGS. 14 through 16 illustrate top down plan views of different embodiments of segmented input capacitors for use with bond wires of an input transformer of an RF power transistor package.
Figure 15:
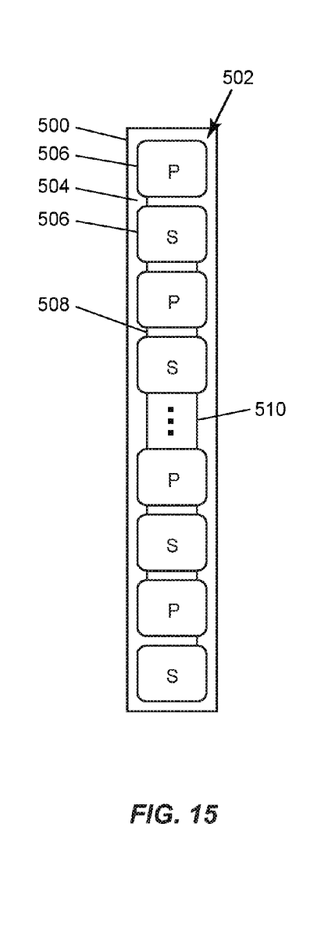

FIGS. 14 through 15 illustrate different embodiments of the input capacitors for connecting the transformer to the input lead and gate of the RF power transistor.

According to the embodiment shown in FIG. 14, each input capacitor 500 has a top side 502 separated from a bottom side (out of view) by a dielectric 504 and terminals 506 at the top side 502 for the primary (P) and secondary (S) bond wire connections of the input transformer. The terminals 506 connected to the primary bond wires are separated from the terminals 506 connected to the secondary bond wires to ensure electrical isolation of the primary and secondary side of the transformer.

According to the embodiment shown in FIG. 15, each input capacitor 500 has one or more internal metallization layers 508, 510 which are patterned to connect together all of the primary bond wires of the transformer separately from all of the secondary bond wires to maintain electrical isolation between the primary and secondary sides.

Figure 16:
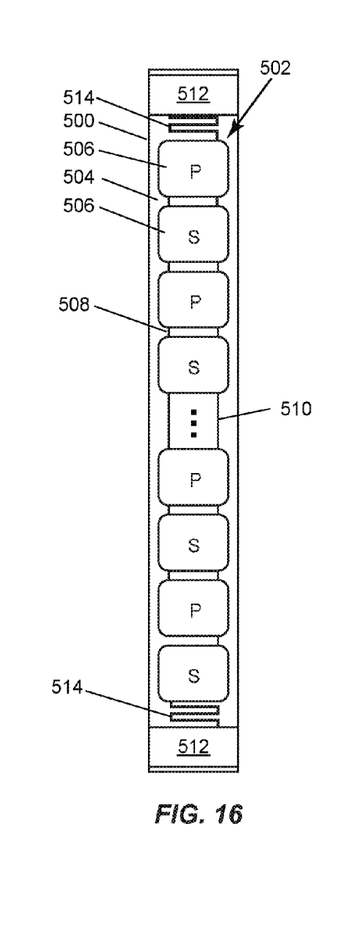

The embodiment shown in FIG. 16 is similar to the embodiment shown in FIG. 15, however, gate bias pads 512 are provided at opposing ends of the capacitor 500 and each connected to the adjacent primary (P)/secondary (S) terminal 506 by a respective low resistive (e.g. 10 Ohms) connection 514.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RF power transistor package, comprising:
   an input lead;
   an output lead;
   an RF power transistor having a gate, a drain and a defined gain response over an RF frequency range for which the RF power transistor is configured to operate;
   a transformer electrically isolating and inductively coupling the gate of the RF power transistor to the input lead, the transformer configured to block signals below the RF frequency range of the RF power transistor and pass signals within the RF frequency range of the RF power transistor; and
   a DC feed terminal for providing DC bias to the gate of the RF power transistor.

2. The RF power transistor package of claim 1, wherein the transformer comprises:
   a first set of bond wires connected to the input lead; and
   a second set of bond wires connected to the gate of the RF power transistor,
   wherein the first set of bond wires is electrically disconnected from the second set of bond wires,
   wherein the first set of bond wires is inductively coupled to the second set of bond wires over at least part of the length of the bond wires.

3. The RF power transistor package of claim 2, wherein a mutual coupling coefficient between the first set of bond wires and the second set of bond wires is at least 0.25.

4. The RF power transistor package of claim 2, wherein the first set of bond wires includes at least twice as many bond wires as the second set.

5. The RF power transistor package of claim 2, wherein the second set of bond wires includes at least twice as many bond wires as the first set.

6. The RF power transistor package of claim 2, wherein the bond wires in the first set of bond wires have the same shape and spacing as the bond wires included in the second set of bond wires.

7. The RF power transistor package of claim 2, wherein:
   a height of the bond wires in the first set ranges between 10 mils and 60 mils;
   a height of the bond wires in the second set ranges between 10 mils and 60 mils; and
   adjacent bond wires of the first and second sets are spaced apart by between 6 mils and 20 mils.

8. The RF power transistor package of claim 2, wherein:
   the first set of bond wires is connected to the input lead at a first end, to a first capacitor at a second end and to a second capacitor between the first and second ends;
   the second set of bond wires is connected to the gate of the RF power transistor at a first end, to the second capacitor at a second end and to the first capacitor between the first and second ends;
   the first capacitor is segmented between the bond wires from the first and second sets which are adjacent to one another, to electrically isolate the first set of bond wires from the second set of bond wires at the first capacitor; and
   the second capacitor is segmented between bond wires from the first and second sets which are adjacent to one another, to electrically isolate the first set of bond wires from the second set of bond wires at the second capacitor.

9. The RF power transistor package of claim 8, wherein the first capacitor and the second capacitor each comprise a plurality of terminals separated from one another and connected to one or more of the bond wires in the first or second set of bond wires so that the first set of bond wires is electrically isolated from the second set of bond wires at the first capacitor and at the second capacitor.

10. The RF power transistor package of claim 2, wherein:
   the first set of bond wires is connected to the input lead at a first end, to a first capacitor at a second end and to a second capacitor between the first and second ends; and the second set of bond wires is connected to the gate of the RF power transistor at a first end, to a third capacitor at a second end and to a fourth capacitor between the first and second ends.

11. The RF power transistor package of claim 2, further comprising:
an output match circuit electrically coupling the drain of the RF power transistor to the output lead and configured to match an output impedance of the RF power transistor to an impedance seen at the output lead over the RF frequency range of the RF power transistor.

12. The RF power transistor package of claim 2, wherein the second set of bond wires is connected to the gate of the RF power transistor at a first end and to a capacitor at a second end, and wherein a plurality of bond wires connect the DC feed terminal to the capacitor.

13. An RF power transistor package, comprising:
an input lead;
an output lead;
an RF power transistor having an input, an output, an input impedance, an output impedance, and a defined gain response over an RF frequency range for which the RF power transistor is configured to operate;
an output match circuit electrically coupling the output of the RF power transistor to the output lead and configured to match the output impedance of the RF power transistor to an impedance seen at the output lead over the RF frequency range of the RF power transistor, the output match circuit causing a low frequency forward voltage gain bump in the gain response of the RF power transistor at frequencies below the RF frequency range of the RF power transistor;
a transformer electrically isolating and inductively coupling the input of the RF power transistor to the input lead and configured to block signals having a frequency below the RF frequency range of the RF power transistor so that low frequency signals are not amplified by the low frequency forward voltage gain bump; and
a DC feed terminal for providing DC bias to the input of the RF power transistor.

14. The RF power transistor package of claim 13, wherein the transformer is configured to match the input impedance of the RF power transistor to an impedance seen at the input lead over the RF frequency range of the RF power transistor.

15. The RF power transistor package of claim 13, wherein the transformer comprises:
a first set of bond wires connected to the input lead; and
a second set of bond wires connected to the input of the RF power transistor,
wherein the first set of bond wires is electrically disconnected from the second set of bond wires,
wherein the first set of bond wires is inductively coupled to the second set of bond wires over at least part of the length of the bond wires.

16. The RF power transistor package of claim 15, wherein a mutual coupling coefficient between the first set of bond wires and the second set of bond wires is at least 0.25.

17. The RF power transistor package of claim 15, wherein the bond wires in the first set of bond wires have the same shape and spacing as the bond wires included in the second set of bond wires.

18. The RF power transistor package of claim 15, wherein:
a height of the bond wires in the first set ranges between 10 mils and 60 mils;
a height of the bond wires in the second set ranges between 10 mils and 60 mils; and
adjacent bond wires of the first and second sets are spaced apart by between 6 mils and 20 mils.

19. The RF power transistor package of claim 15, wherein:
the first set of bond wires is connected to the input lead at a first end, to a first capacitor at a second end and to a second capacitor between the first and second ends;
the second set of bond wires is connected to the input of the RF power transistor at a first end, to the second capacitor at a second end and to the first capacitor between the first and second ends;
the first capacitor is segmented between the bond wires from the first and second sets which are adjacent to one another, to electrically isolate the first set of bond wires from the second set of bond wires at the first capacitor; and
the second capacitor is segmented between bond wires from the first and second sets which are adjacent to one another, to electrically isolate the first set of bond wires from the second set of bond wires at the second capacitor.

20. The RF power transistor package of claim 19, wherein the first capacitor and the second capacitor each comprise a plurality of terminals separated from one another and connected to one or more of the bond wires in the first or second set of bond wires so that the first set of bond wires is electrically isolated from the second set of bond wires at the first capacitor and at the second capacitor.

21. The RF power transistor package of claim 15, wherein:
the first set of bond wires is connected to the input lead at a first end, to a first capacitor at a second end and to a second capacitor between the first and second ends; and
the second set of bond wires is connected to the input of the RF power transistor at a first end, to a third capacitor at a second end and to a fourth capacitor between the first and second ends.

22. The RF power transistor package of claim 13, wherein the second set of bond wires is connected to the gate of the RF power transistor at a first end and to a capacitor at a second end, and wherein a plurality of bond wires connect the DC feed terminal to the capacitor.

* * * * *